(12) United States Patent
Thurairajaratnam et al.

(10) Patent No.: US 8,889,999 B2
(45) Date of Patent: Nov. 18, 2014

(54) MULTIPLE LAYER PRINTED CIRCUIT BOARD WITH UNPLATED VIAS

(75) Inventors: Aritharan Thurairajaratnam, San Jose, CA (US); David Senk, San Ramon, CA (US)

(73) Assignee: Cisco Technology, Inc., San Jose, CA (US)

( * ) Notice: Subject to any disclaimer, the term of this patent is extended or adjusted under 35 U.S.C. 154(b) by 426 days.

(21) Appl. No.: 13/280,008

(22) Filed: Oct. 24, 2011

(65) Prior Publication Data

US 2013/0098671 A1   Apr. 25, 2013

(51) Int. Cl.
*H05K 1/11* (2006.01)
*H05K 1/02* (2006.01)
*H05K 3/42* (2006.01)

(52) U.S. Cl.
CPC ...... *H05K 1/024* (2013.01); *H05K 2201/09063* (2013.01); *H05K 1/0251* (2013.01); *H05K 1/116* (2013.01); *H05K 3/429* (2013.01); *H05K 2203/0242* (2013.01)
USPC ............ 174/262; 174/261; 174/266

(58) Field of Classification Search
CPC ............... H05K 1/0251; H05K 1/0253
USPC ............... 174/262, 266, 261
See application file for complete search history.

(56) References Cited

U.S. PATENT DOCUMENTS

| | | | |
|---|---|---|---|
| 6,163,233 A * | 12/2000 | Adkins | 333/1 |
| 6,722,031 B2 * | 4/2004 | Japp et al. | 29/852 |
| 7,096,555 B2 * | 8/2006 | Tourne et al. | 29/402.06 |
| 7,139,177 B2 * | 11/2006 | Gottlieb | 361/788 |
| 7,249,337 B2 * | 7/2007 | Gisin et al. | 716/115 |
| 7,292,452 B2 * | 11/2007 | Ng et al. | 361/780 |
| 7,501,586 B2 * | 3/2009 | Wig et al. | 174/262 |
| 7,804,694 B2 * | 9/2010 | Ng et al. | 361/780 |
| 8,158,892 B2 * | 4/2012 | Goergen et al. | 174/266 |
| 8,212,154 B2 * | 7/2012 | Kashiwakura | 174/262 |
| 8,471,767 B2 * | 6/2013 | Satomi | 343/700 MS |
| 8,476,537 B2 * | 7/2013 | Kushta | 174/262 |
| 8,498,128 B2 * | 7/2013 | Wu et al. | 361/760 |
| 8,542,494 B2 * | 9/2013 | Mutnury et al. | 361/748 |
| 2006/0185890 A1 * | 8/2006 | Robinson | 174/255 |
| 2007/0091581 A1 * | 4/2007 | Gisin et al. | 361/782 |
| 2008/0265919 A1 * | 10/2008 | Izadian | 324/754 |
| 2009/0188710 A1 * | 7/2009 | Senk | 174/262 |
| 2010/0307798 A1 * | 12/2010 | Izadian | 174/255 |
| 2013/0112465 A1 * | 5/2013 | Duvanenko | 174/260 |
| 2013/0181350 A1 * | 7/2013 | Pelley et al. | 257/754 |
| 2013/0199834 A1 * | 8/2013 | De Geest et al. | 174/266 |

OTHER PUBLICATIONS

Dr. Abe Riazi, "Stackup analysis can help to optimize layer count, trace width and spacing and electrical performance", PCB Stack-up Analysis and Design, Parts 1 and 2, Oct. 1, 2008, http://pcdandf.com/cms/magazine/95/5255, pp. 1-12.

(Continued)

*Primary Examiner* — Jeremy C Norris
*Assistant Examiner* — Nathan Milakovich
(74) *Attorney, Agent, or Firm* — Brinks Gilson & Lione

(57) ABSTRACT

A printed circuit board (PCB) stack-up has a signal via configured to transmit a signal through at least two different layers of the PCB stack-up, a reference structure that is at least a portion of a return path for the signal; and an unplated via disposed in an area surrounding the signal via. The unplated via is disposed in the area surrounding the signal via to improve the characteristic impedance of the signal via.

21 Claims, 7 Drawing Sheets

(56) References Cited

OTHER PUBLICATIONS

R. Barrett, "Stripline", http://www.microwaves101.com/encyclopedia/stripline.cfm , Aug. 21, 2010, pp. 1-6.

Yunliang Zhu et al, "Multilayer Coplanar Waveguide Transmission Lines Compatible with Standard Digital Silicon Technologies", 2007 International Microwave Symposium (IMS).

* cited by examiner

US 8,889,999 B2

MULTIPLE LAYER PRINTED CIRCUIT BOARD WITH UNPLATED VIAS

FIELD

The present embodiments relate to printed circuit boards and, more particularly, to printed circuit boards having multiple layers.

BACKGROUND

Electrical signals may be transmitted on a transmission line of a printed circuit board (PCB). The transmission line may be a single trace or may be a differential pair of traces. The transmission line may extend over multiple layers of the printed circuit board. Plated vias may connect parts of transmission lines on the different layers.

DETAILED DESCRIPTION

Overview

A printed circuit board (PCB) stack-up includes a signal via configured to transmit a signal through at least two different layers of the PCB stack-up, a reference structure that is at least a portion of a return path for the signal; and an unplated via disposed in an area surrounding the signal via. The unplated via is disposed in the area surrounding the signal via to improve a characteristic impedance of the signal via.

DESCRIPTION OF EXAMPLE EMBODIMENTS

The present disclosure describes a PCB stack-up that includes one or more unplated vias positioned in areas surrounding a signal via. The signal via may connect signal traces disposed in or on different layers of the PCB stack-up. The unplated vias may extend at least partially through the PCB stack-up and may be disposed in between or substantially in between the signal via and a reference structure that functions as a return path. In addition or alternatively, the unplated vias may be disposed in between or substantially in between two signal traces, such as a differential pair of signal traces. The unplated vias may reduce an effective dielectric constant in the area surrounding the signal vias, which may increase the characteristic impedance of the signal vias, and in turn, improve impedance matching between the signal vias and the signal traces.

Figure 1:
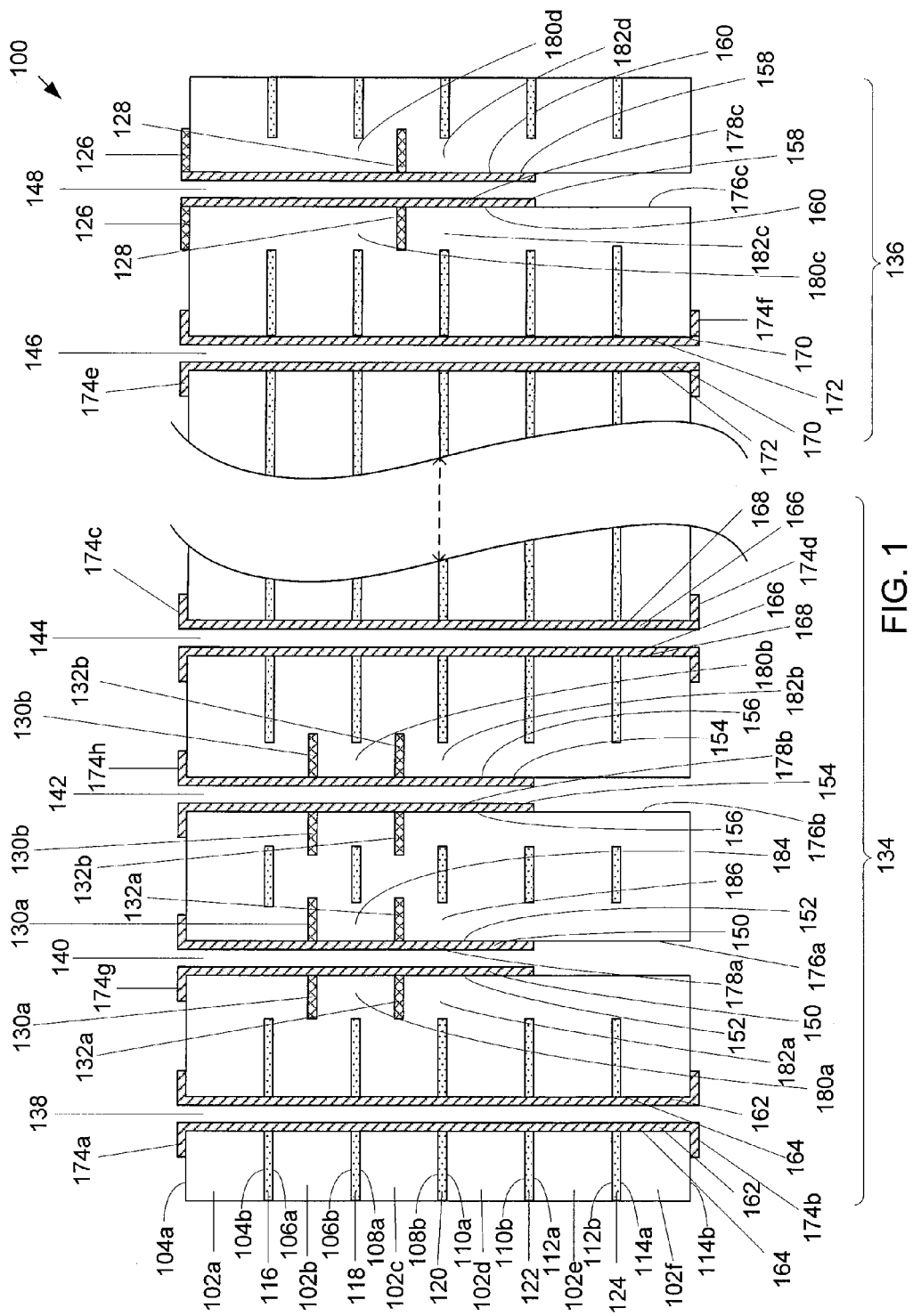
FIG. 1 illustrates a cross-sectional view of one example embodiment of a stack of printed circuit board layers.

FIG. 1 illustrates a cross-section of an example apparatus that includes a printed circuit board (PCB) 100 having multiple layers. The PCB 100 having multiple layers may be referred to as a stack of PCB layers or a PCB stack-up. A layer of the PCB stack-up may be a planar structure of insulating or partially insulating material having opposing planar surfaces where at least one of the opposing planar surfaces is adjacent to and/or facing a ground reference. Insulating or partially insulating material may include, but is not limited to including, fiberglass, epoxy, glass, resin, or a combination thereof. In addition, a layer of the PCB stack-up may be a substrate between a transmission line carrying a signal and one or more ground references. The ground references may be planar structures that are aligned or substantially aligned with the PCB layers. Further, the ground references may be parallel or substantially parallel with each other. The ground references may be made of an electrically conductive material, such as copper, gold, silver, platinum, or any other conductive material.

The example PCB stack-up 100 may include six layers 102, including a first layer 102a, a second layer 102b, a third layer 102c, a fourth layer 102d, a fifth layer 102e, and a sixth layer 102f. The number of layers that may be included in the PCB stack-up 100 may vary, with a minimum number being two layers. In addition, the layers 102a-102f may be adjacent to and/or separated by one or more ground references. The first layer 102a has a first surface 104a opposing a second surface 104b. The second surface 104b is adjacent and/or facing a first ground reference 116. The second layer 102b has a first surface 106a opposing a second surface 106b. In addition, the first surface 106a is adjacent and/or facing the first ground reference 116. The second surface 106b is adjacent and/or facing a second ground reference 118. The third layer 102c has a first surface 108a opposing a second surface 108b. In addition, the first surface 108a is adjacent and/or facing the second ground reference 118. The second surface 108b is adjacent and/or facing a third ground reference 120. The fourth layer 102d has a first surface 110a opposing a second surface 110b. In addition, the first surface 110a is adjacent and/or facing the third ground reference 120. The second surface 110b is adjacent and/or facing a fourth ground reference 122. The fifth layer 102e has a first surface 112a opposing a second surface 112b. In addition, the first surface 112a is adjacent and/or facing the fourth ground reference 122. The second surface 112b is adjacent and/or facing a fifth ground reference 124. The sixth layer 102f has a first surface 114a opposing a second surface 114b. In addition, the first surface 114a is adjacent and/or facing the fifth ground reference 124.

The first layer 102a and the sixth layer 102f may be considered outer layers. An outer layer may be a layer where substantially only one of the opposing planar surfaces (e.g., only one of the first surface and the second surface) is adjacent a ground reference. The other of the opposing planar surfaces, i.e., the surface that is not adjacent to a ground, may be exposed to the environment surrounding the PCB stack-up, such as air. For example, the second surface 104b of the first layer 102a is adjacent the first ground reference 116, and the first surface 104a of the first layer 102a is exposed to the surrounding environment (e.g., air, soldermask, etc.). As another example, the first surface 114a of the sixth layer 102f is adjacent the fifth ground reference 124, and the second surface 114b of the sixth layer 102f is exposed to the surrounding environment (e.g., air, soldermask, etc.).

The second layer 102b, the third layer 102c, the fourth layer 102d, and/or the fifth layer 102e may be considered inner layers. An inner layer may be a layer where both of the opposing planar surfaces (e.g., both the first surface and the second surface) are adjacent a ground reference. For example, the first surface 106a of the second layer 102b is adjacent the first ground reference 116 and the second surface 106b of the second layer 102b is adjacent the second ground reference 118. The first surface 108a of the third layer 102c is adjacent the second ground reference 118, and the second surface 108b of the second layer 102b is adjacent the third ground reference 120. The first surface 110a of the fourth layer 102d is adjacent the third ground reference 120, and the second surface 110a of the fourth layer 102d is adjacent the fourth ground reference 122. The first surface 112a of the fifth layer 102e is adjacent the fourth ground reference 122, and the second surface 112a of the fifth layer 102e is adjacent the fifth ground reference 124.

The PCB stack-up 100 may include one or more transmission lines that are configured to carry one or more signals. A signal may be an analog or a digital signal and/or comprise an analog or digital waveform. In addition or alternatively, the signal may be an alternating current (AC) signal, a direct current (DC) signal. The AC signal may be a radio frequency (RF) signal having any suitable frequency, as for example a frequency of about 3 kHz or higher. The DC signal may be a power signal used to power one or more active devices (not shown) in communication with the PCB stack-up 100. An active device, such as the active device described below with reference to FIG. 7, may include an integrated circuit (IC), such as a field programmable gate array (FPGA) or an application specific integrated circuit (ASIC), a transistor, a controller, a memory chip, a diode, an operational amplifier, or any other electronic device, circuit, or component that may require power, such as DC power, to operate.

A transmission line may comprise at least two conductors, including a signal conductor, as for example conductive traces 126 and 128 in connection with a signal via 148, and a return conductor, as for example a ground via 146. In the PCB stack-up 100, the signal conductor may include one or more conductive traces, as for examples the conductive traces 126, 128. The conductive traces may comprise any conductive material, such as copper, gold, silver, or platinum, as examples. The conductive traces may be manufactured using masking and etching techniques or milling techniques, as examples. The one or more conductive traces may be disposed on or in a layer of the PCB stack-up 100. For example, a conductive trace may be disposed on a first surface or a second surface of an outer layer of the PCB stack-up 100. In addition, the first surface or the second surface may be a surface of the outer layer that is exposed to the environment (e.g., air, soldermask, etc.). For example, in FIG. 1, a conductive trace 126 is disposed on the first surface 104a of the first layer 102a. Where the conductive trace is disposed on a surface of an outer layer and is exposed to the environment (e.g., air, soldermask, etc.), a transmission line comprising the conductive trace may have a microstrip configuration. A microstrip configuration may refer to a transmission line configuration where the conductive trace is separated from a ground reference by the substrate, and where the conductive trace is exposed to the environment (e.g., air, soldermask, etc.). To illustrate, the conductive trace 126, the first layer 102a, and the first ground reference 116 may form a microstrip transmission line configuration.

In addition, the one or more conductive traces included in PCB stack-up 100 may be disposed in a layer of the PCB stack-up 100. For example, the one or more conductive traces may be disposed in between two of the ground references. In FIG. 1, a conductive trace 128 is disposed in the third layer 102c and in between the second ground reference 118 and the third ground reference 120. In addition, in FIG. 1, two conductive traces 130a, 130b are disposed in the second layer 102b and in between the first ground reference 116 and the second ground reference 118. Also, in FIG. 1, two conductive traces 132a, 132b are disposed in the third layer 102c and in between the second ground reference 118 and the third ground reference 120. Where one or more conductive traces are disposed in a layer and in between two ground reference planes, the one or more conductive traces, the layer, and the two ground references planes may be configured in a stripline transmission line configuration.

A transmission line that includes only one conductive trace as the signal conductor may be a single-ended transmission line and the single conductive trace may be a single-ended trace. A single-ended transmission line may be configured in a microstrip configuration or a stripline configuration. Alternatively, a transmission line may include two conductive traces, or a pair of conductive traces, and may be a differential transmission line. The conductive traces of the may be differential conductive traces. A pair of signals may be transmitted over the differential transmission line and together may be referred to as a differential signal. The pair of signals of the differential signal may be equal and opposite in magnitude, or substantially equal and opposite in magnitude, and/or equal or substantially equal in phase. In addition, the differential transmission line may be configured in a microstrip configuration or a stripline configuration.

FIG. 1 shows two separate portions, a first portion 134 and a second portion 136, of the PCB stack 100. The first portion 134 may include transmission lines configured in a differential configuration. A first differential transmission line may include the pair of traces 130a and 130b and may be configured to transmit a differential signal. The pair of traces 130a and 130b are disposed in the second layer 102b and in between the first ground reference 116 and the second ground reference 118. The pair of traces 130a and 130b being disposed in the second layer 102b and in between the first and second ground references 116, 118 may comprise a stripline configuration. A second differential transmission line may include the pair of traces 132a and 132b and may be configured to transmit a differential signal. The pair of traces 132a and 132b are disposed in the third layer 102c and in between the second ground reference 118 and the third ground reference 120. The pair of traces 132a and 132b being disposed in the third layer 102c and in between the second and third ground references 118, 120 may comprise a stripline configuration.

The second portion 136 of the PCB stack-up 100 may include transmission lines configured in a single-ended configuration. A first single-ended transmission line may include the single-ended conductive trace 126. The single-ended conductive trace 126 is disposed on the first surface 104a of the first layer 102a and separated from the first ground reference 116 by the first layer 102a. The single-ended trace 126 being disposed on the first surface 104a of the first layer 102a and being separated from the first ground reference 116 by the first layer 102a may comprise a microstrip configuration. A second single-ended transmission line may include the single-ended conductive trace 128. The single-ended conductive trace 128 is disposed in the third layer 102c and is disposed in between the second ground reference 118 and the third ground reference 120. The single-ended conductive trace 128 being disposed in the third layer 102c and being disposed in between the second ground reference 118 and the third ground reference 120 may comprise a stripline configuration.

Alternative embodiments of the PCB stack-up 100 may include substantially only the first portion 134, substantially only the second portion 136, multiple first portions 134, multiple second portions 136, or one or more combinations thereof. Other alternative embodiments of the PCB stack-up 100 may include alternative configurations or different combinations of the transmission lines shown in FIG. 1. For example, an alternative PCB stack-up may include a differential transmission line configured in a microstrip configuration. As another example, an alternative PCB stack-up may not have a transmission line, single-ended or differential, that is configured in a microstrip configuration. As another example, an alternative PCB stack-up may not have a transmission line, single-ended or differential, that is configured in a stripline configuration. The alternative PCB stack-up may include one or more transmission lines that are configured in microstrip configurations, where one or more of the conductive traces, configured as single-ended traces and/or differential traces, are disposed on planar surfaces of the outer layers that are exposed to the environment (e.g., air, soldermask, etc.). An alternative PCB stack-up may include any number of layers, where there are at least two layers. In addition, conductive traces may be disposed in any of the layers. For example, in FIG. 1, in addition to the conductive traces 128, 130a, 130b, 132a, 132b being disposed in the second and/or the third layers 118, 120, one or more of the conductive traces 128, 130a, 130b, 132a, 132b, or alternatively other conductive traces may disposed in other layers, such as the first layer 102a, the fourth layer 102d, the fifth layer 102e, and/or the sixth layer 102f.

Conductive traces that are disposed in or on different layers, or alternatively on different opposing surfaces of the same layer, may be interconnected through one or more plated vias. Similarly, two different ground references may be connected to each other by each being connected to one or more plated vias. Herein, the phrase "connected to" or "connected with" is defined to mean directly connected to or indirectly connected through one or more intermediate components/conductive materials, unless otherwise specifically described.

A via may be a hole, an opening, or a spacing that extends partially or completely through one or more layers of the PCB stack-up 100. A via that extends completely through at least one layer may be referred to as a through-layer via. In one example, the via may extend completely through all of the layers of the PCB stack-up 100. The via may extend perpendicular or substantially perpendicular to one or both of the opposing planar surfaces of one or more of the layers. A plated via may be a via that is electrically conductive over an entire length of the via. Alternatively, the plated via may be electrically conductive over a length that is less than the entire length of the via and non-conductive over a remaining length of the via. Alternatively, the plated via may have two or more non-contiguous electrically conductive portions that are separated by non-conductive portions. The via may be electrically conductive by having inner walls that are plated with an electrically conductive material, such as copper, gold, silver, or platinum. Other electrically conductive materials may be used. A non-plated via may be a via that does not have electrically conductive inner walls, or at least does not have an amount of conductive plating that is sufficient to connect together any two conductive structures, such as traces and/or ground references, that are disposed in different layers or separated by one or more layers.

In one example of the PCB stack-up 100, at least one plated via may be configured to connect two or more different ground references together and/or two or more different conductive traces together. Alternatively or in addition, the plated vias may be configured to not connect any ground reference with any signal conductor of a transmission line. A via that connects two or more ground references may be referred to as a ground via. A via that connects two or more signal conductors or conductive traces may be referred to as a signal via.

The PCB stack-up 100 includes a plurality of plated vias. At least one of the plurality of plated vias comprises a signal via. In addition, at least one of the plated vias comprises a conductive structure that is in a proximity of the signal via to be a reference for a signal propagating through the signal via. As previously mentioned, a transmission line may include at least two conductors, such as a signal conductor and a return conductor. For a signal to propagate along the transmission line, the signal conductor and the return conductor may be connected in a loop to form a circuit. Additionally, a complete path for transmission of a signal may include multiple transmission lines connected by one or more signal vias, such as in a multi-layer PCB stack-up. A signal propagating along the path may propagate along a first signal conductor of a first transmission line that is in or on one layer, may travel through and/or enter into a signal via connected to the first signal conductor, and may exit from the signal via and/or transition to a second signal conductor that is connected to the signal via, the second signal conductor being part of a second transmission line in or on a different layer, and propagate along the second signal conductor. The signal via may have an input or "signal in" point, position, or location, where the first signal conductor is connected to the signal via and the signal enters the signal via. Similarly, the signal via may have an output or a "signal out" point, position, or location, where the second signal conductor is connected to the signal via and the signal exits the signal via. An alternative multi-layer PCB stack-up may comprise a multi-drop configuration, which may include one input or "signal in" point, position, or location and multiple outputs or "signal out" points, position, or locations. In the multi-drop configuration, the signal may enter the via at the "signal in" position of the signal via and exit the via at the multiple "signal out" positions of the signal via.

A complete path, similar to the individual transmission lines, may include a signal conductor path and a return conductor path. The signal conductor path may include the signal conductors of the transmission lines and the one or more signal vias that the signal conductors are connected to. The signal conductor path and the return conductor path may be connected in a loop to form a circuit. A signal propagating along the signal conductor path may couple to a conductive structure, or one or more of a plurality of conductive structures, adjacent the signal via to form or create at least part of the return conductor path. The conductive structure may be the nearest or one of the nearest conductive structures to the signal via. In addition or alternatively, the conductive structure may extend in substantially the same direction as the signal via. The conductive structure may or may not be connected to one or more ground references. Whether or not the conductive structure is connected to one or more ground references, the conductive structure may provide a reference structure for the signal propagating along the signal conductor path. A conductive structure that is in the proximity of the signal via may be a conductive structure that is at least part of the return conductor path because the conductive structure is a sufficient distance to the signal via for the signal propagating along the signal via to substantially couple to the conductive structure. Alternatively, a conductive structure that may not be a conductive structure in the proximity of the signal via is a sufficient distance away from the signal via for the signal to substantially couple to the conductive structure. The conductive structure that is in the proximity of the signal via may be a ground via. A ground via may be a plated via that is connected to one or more ground references. However, the conductive structure may be of a different type other than a ground via, such as a via that is configured to supply a power signal, for example. Hereinafter, a conductive structure that may be disposed in the proximity of the signal via to be at least a portion of the return conductor path may be referred to as a reference structure.

The PCB stack-up 100 in FIG. 1 shows six plated vias, including a first via 138, a second via 140, a third via 142 a fourth via 144, a fifth via 146, and a sixth via 148. The number of vias in the PCB stack-up 100 may generally vary. It should be appreciated that additional vias may include, and that such vias may include a signal via and a reference structure that is in the proximity of the signal via such that a return path is effectively formed. The second via 140, the third via 142, and the sixth via may be signal vias. The second via 140 may be connected to the trace 130a disposed in the second layer 102b and to the trace 132a disposed in the third layer 102c. The trace 130a may be connected to the second via 140 and in connection with the trace 132a by being connected to conductive plating 150 that is disposed along an inner wall 152 of the second via 140. Similarly, the third via 142 may be connected to the trace 130b disposed in the second layer 102b and to the trace 132b disposed in the third layer 102c. The trace 130b may be connected to the third via 142 and in connection with the trace 132b by being connected to conductive plating 154 that is disposed along an inner wall 156 of the third via 142. Likewise, the sixth via 148 may be connected to the trace 126 disposed on the first surface 104a of the first layer 102a and to the trace 128 disposed in the third layer 102c. The trace 126 may be connected to the sixth via 148 and in connection with the trace 128 by being connected to conductive plating 158 that is disposed along an inner wall 160 of the sixth via 148.

The first via 138, the fourth via 144, and the fifth via 146 may be reference structures that are in proximity to signal vias 140, 142, and/or 148 such that the vias 138, 144, 146 are at least part of the return conductor paths. In the example PCB stack-up 100, the first via 138, the fourth via 144, and the fifth via 146 are ground vias. However, in other example PCB stack-ups, the first via 138, the fourth via 144, and/or fifth via 146 may be different types of reference structures that are in the proximity of the signal vias 140, 142, and/or 148, such as power supply vias as previously described.

Additionally, there may be more or fewer reference structures than the first via 138, fourth via 144, and the fifth via 146 that are shown. For example, in the first portion 134, there may be a single reference structure, e.g., either the first via 138 or the fourth via 144, that is at least part of the return path for a differential signal propagating along differential traces 130a, 130b and/or differential traces 132a, 132b. In addition, there may be more reference structures than the first via 138 and the fourth via 144 that are return paths for the differential signal. Similarly, in the second portion 136, there may be more reference structures other than the fifth via 146. The other reference structures may comprise ground vias, other types of reference structures such as power supply vias, or combinations thereof.

The first via 138, the fourth via 144, and the fifth via 146, configured as ground vias, may each be connected to at least one of the ground references 116-124. In the PCB stack-up 100 shown in FIG. 1, the first, fourth, and fifth vias 138, 144, 146 are each connected to all of the ground references 116-124. The ground references 116-124 may be connected to the first via 138 and in connection with each other by being connected to conductive plating 162 that is disposed along an inner wall 164 of the first via 138. Similarly, the ground references 116-124 may be connected to the fourth via 144 and in connection with each other by being connected to conductive plating 166 that is disposed along an inner wall 168 of the fourth via 144. Likewise, the ground references 116-124 may be connected to the fifth via 146 and in connection with each other by being connected to conductive plating 170 that is disposed along an inner wall 172 of the sixth via 148.

FIG. 1 shows the conductive platings 162, 166, 170 of the first, fourth, and fifth vias 138, 144, 146 extending an entire length of the PCB stack 100, from the first surface 104a of the first layer 102a to the second surface 114b of the sixth layer 102f. In other example PCB stack-ups, the conductive plating 162 of the first via 138, the conductive plating 166 of the fourth via 144, and/or the conductive plating 170 of the fifth via 146 may extend less than the entire length of the PCB stack-up 100. Where the conductive platings 162, 166, and/or 170 extend to a surface of an outer layer that is exposed to the surrounding environment, the conductive plating may extend to surface pads disposed on the surface. A surface pad may comprise a conductive material, such as copper, gold, silver, platinum, or any other conductive material, that is the same or a different conductive material as the conductive material of the conductive plating. For example, in FIG. 1, the conductive plating 162 of the first via 138 extends and/or is connected to a first surface pad 174a disposed on the first surface 104a of the first layer 102a. The conductive plating 162 of first via 138 also extends to and/or is connected to a second surface pad 174b disposed on the second surface 114b of the sixth layer 102f. Similarly, the conductive plating 166 of the fourth via 144 extends and/or is connected to a third surface pad 174c disposed on the first surface 104a of the first layer 102a. Also, the conductive plating 166 of fourth via 144 extends and/or is connected to a fourth surface pad 174d disposed on the second surface 114b of the sixth layer 102f. Likewise, the conductive plating 170 of the fifth via 146 extends and/or is connected to a fifth surface pad 174e disposed on the first surface 104a of the first layer 102a. Also, the conductive plating 170 of fifth via 146 extends and/or is connected to a sixth surface pad 174f disposed on the second surface 114b of the sixth layer 102f. Similarly, the conductive platings 150, 154, 156 of the second, third, and sixth vias 140, 142, 148 may extend to an exposed surface of one of the outer layers and to a surface pad. The conductive plating 150 may extend and/or is connected to a seventh surface pad 174g. The conductive plating 154 may extend and/or is connected to an eighth surface pad 174h.

In some example embodiments, the conductive plating of the signal vias, e.g., the conductive plating 150 of the second via 140, the conductive plating 154 of the third via 142 and/or the conductive plating 158 of the sixth via 148, may extend a length that is less than an entire length of the PCB stack-up 100, from the first surface 104a of the first layer 102a to the second surface 114b of the sixth layer 102f. For example, in FIG. 1, the conductive plating 150 of the second via 140 extends from the first surface 104a of the first layer 102a to a position within the PCB stack-up 100 that is in between the conductive trace 132a to the second surface 114b of the sixth layer 102f. Similarly, the conductive plating 156 of the third via 142 extends from the first surface 104a of the first layer 102a to a position within the PCB stack-up 100 that is in between the conductive trace 132b to the second surface 114b of the sixth layer 102f. Also, the conductive plating 160 of the sixth via 148 extends from the first surface 104a of the first layer 102a to a position within the PCB stack-up 100 that is in between the conductive trace 132b to the second surface 114b of the sixth layer 102f. In alternative example embodiments, one or more of the conductive platings 150, 154 may extend from the second surface 114b of the sixth layer 102f to a position in between the conductive traces 130a, 130b and the first surface 104a of the first layer 102a. In other alternative example embodiments, one or more of the conductive platings 150, 154 may extend from a position in between the first surface 104a of the first layer 102a and conductive traces 130a, 130b to a position in between the second surface 114b of the sixth layer 102f and the conductive traces 132a, 132b.

During manufacture of the PCB stack-up 100, a plating process that is used to plate the vias may plate the signal vias 150, 154, 158 for the entire length of the PCB stack-up 100, from the first surface 104a of the first layer 102a to the second surface 114b of the sixth layer 102f. Depending on the disposition of the conductive traces 130a, 130b, 132a, 132b, 126, and/or 128 in the PCB stack-up 100, one or more portions of the conductive plating 150, 154, 158 that extend to the first surface 104a of the first layer 102a and/or to the second surface 114b of the sixth layer 102f may not be needed to connect to or more conductive traces. For example, in FIG. 1, the conductive platings 150, 154 of the second and third vias 140, 142 connect the differential traces 130a, 130b disposed in the second layer 102b with the differential traces 132a, 132b disposed in the third layer 102c. Because there are no traces disposed in the other layers (i.e., the first layer 102a, the fourth layer 102d, the fifth layer 102e, or the sixth layer 102f) and/or on the first surface 104a of the first layer 102a and/or on the second surface 114b of the sixth layer 102f, portions of the conductive plating 150 extending from the differential pair of traces 130a, 130b to the first surface 104a of the first layer 102a and/or portions of the conductive plating 154 extending from the differential pair of traces 132a, 132b to the second surface 114b of the sixth layer 102f may not be needed for a differential signal to propagate from the differential traces 130a, 130b, through the second and third vias 140, 142, and to the differential traces 132a, 132b. Similarly, the conductive plating 158 of the sixth via 148 connects the trace 126 disposed on the first surface 104a of the first layer 102a to the trace 128 disposed in the third layer 102c. Because there are no traces disposed in the other layers (i.e., the fourth layer 102d, the fifth layer 102e, or the sixth layer 102f) and/or on the second surface 114b of the sixth layer 1021, portions of the conductive plating 158 extending from the trace 128 to the second surface 114b of the sixth layer 102f may not be needed for a signal to propagate from the trace 126, through the sixth via 148, and to the trace 128.

Portions of the conductive platings 150, 154, and/or 158 that are not needed for signal propagation may be referred to as via stubs. In addition to via stubs not being needed for signal propagation, via stubs may also be undesirable elements of the PCB stack-up 100. To illustrate, a differential signal may propagate along differential traces in one layer, transition through a pair of vias, and propagate along differential traces in a different layer. As the differential signal transitions from the vias to the differential traces in the other layer, some of the energy of the differential signal may travel into one or both of the via stubs. Via stubs may create an impedance mismatch in the signal path, which may result in a reflection and/or energy loss of the signal. Electrically, a via stub may effectively function as a capacitor and serve to introduce a capacitance in the signal path, which may couple energy from the differential signal. The amount of signal loss of the differential signal may be dependent upon, but is not limited to being dependent upon, a length of the via stub. For example, as a length of the via stub increases, more loss of the differential signal may occur.

To reduce the length of a via stub, a conductive plating removal process such as a back drilling process may be performed. The back drilling process may be performed after plating and may involve drilling partially through the plated vias to remove unnecessary and/or unwanted portions of the conductive plating. In some situations, the back drilling process may not remove all of the via stub material due to imprecision of the back drilling process. For example, the back drilling may avoid drilling too close to the signal path in order to avoid damaging or destroying the signal path. At least some of the via stubs may remain after performing the back drilling process.

FIG. 1 shows unplated portions 176a, 176b, 176c and via stubs 178a, 178b, 178c, which may be illustrative of unplated portions and via stubs, respectively, of signal vias after plating and back drilling processes are performed on the PCB stack-up 100. In FIG. 1, the unplated portion 176a of the second via 140 extends from the second surface 114b of the sixth layer 102f to a position in between the second surface 114b of the sixth layer 102f and the conductive trace 132a. Also, the via stub 178a of the second via 140 extends from the position in between the second surface 114b of the sixth layer 102f and the conductive trace 132a to the conductive trace 132a. Similarly, the unplated portion 176b of the third via 142 extends from the second surface 114b of the sixth layer 102f to a position in between the second surface 114b of the sixth layer 102f and the conductive trace 132b. Also, the via stub 178b of the third via 142 extends from the position in between the second surface 114b of the sixth layer 102f and the trace 132b to the trace 132b. Additionally, the unplated portion 176c of the sixth via 148 extends from the second surface 114b of the sixth layer 102f to a position in between the second surface 114b of the sixth layer 102f and the conductive trace 128. Also, the via stub 178c of the sixth via 148 extends from the position in between the second surface 114b of the sixth layer 102f and the trace 128 to the trace 128.

In other example embodiments, one or more of the signal vias 140, 142, and/or 148 may not have an unplated portion, for example, because a back drilling process may not be performed. Alternatively, unplated portions of the signal vias 176a, 176b may also include one or more unplated portions extending from the first surface 104a of the first layer 102a to a position in between the first surface 104a of the first layer 102a to one or more of the traces 130a, 130b. As will be appreciated by those skilled in the art, other configurations may be possible.

Conductive plating of a signal via may extend from one layer to one or more other layers. As a result, the conductive plating of the signal via may extend through one or more areas of the PCB stack-up 100 that is coplanar or otherwise occupied by one or more ground reference planes. If the signal via is connected to one or more of the ground reference planes, the signal via may be shorted to ground. To avoid the signal via being shorted to ground, portions of the ground reference planes intersecting with the signal vias may be removed or "cutout." The portions to be removed or cutout may be removed using a removal process, such as etching or milling before the PCB layers are configured in the stack-up, such as before being laminated together. Cutout portions 180a, b, c, d and 182a, b, c, d (also referred to as anti-pads) of the second ground reference 118 and the third ground reference 120 are shown in FIG. 1. Cutout portions of the first, fourth, and fifth ground references 116, 122, 124 are similarly shown. The substrate material of the PCB layers adjacent to the ground references, in addition to an adhesive material such as a laminate material used to bind the layers together, may fill in the cutout portions during manufacturing of the PCB stack-up 100. Cutout portions may also be removed to prevent differential signal traces 130a, 130b and 132a, 132b from being shorted together. Cutout portions 184 and 186 of the second ground reference 118 and the third ground reference 120 are shown in FIG. 1. Cutout portions of the first, fourth, and fifth ground references 116, 122, 124 are similarly shown.

Although the cutout portions may prevent the signal vias from being shorted to the ground references, energy fields such as electric fields or magnetic fields may be generated between reference structures surrounding the cutout portions, such as portions of the ground references still connected to the signal via after the cutout portions have been removed and parts of the remaining ground references. Energy fields may also be generated between the signal vias and/or the portions of the ground references still connected to the signal vias after the cutout portions have been removed, and other reference structures or portions of other reference structures, such as ground vias, other signal vias carrying other signals, or power vias carrying a DC power supply signal, as examples. The energy fields may generate a coupling effect, which may remove at least some of the energy of a signal propagating through the signal via. Alternatively or in addition, the coupling effect may introduce noise into the signal conductor path. Coupling from the signal via to another reference structure not in the signal conductor path, or coupling between the signal via and the other reference structure not in the signal conductor path, may be referred to as mutual coupling or crosstalk. An electric energy field may produce a capacitance, referred to as mutual capacitance. A magnetic energy field may produce an inductance, referred to as mutual inductance. An amount of mutual capacitance and/or an amount of mutual inductance that is generated may be proportional to an amount of energy of the signal that is coupled away from the signal conductor path. It may be desirable to reduce the amount of mutual capacitance and/or mutual inductance that is generated in order to reduce the amount of mutual coupling, crosstalk, signal loss, and/or noise introduced into the signal conductor path.

FIG. 1 shows signal conductor paths that include two signal conductors in two different layers. In the first portion 134 of the PCB stack-up 100, a first signal conductor path may include the differential traces 130a, 130b and the differential traces 132a, 132b. The second and third vias 140, 142 may be connected to the differential traces 130a, 130b and 132a, 132b and may provide a transition from the differential traces 130a, 130b to the differential traces 132a, 132b, or vice versa. For example, a differential signal may propagate along differential traces 130a, 130b and enter into the second and third vias 140, 142 at inputs or "signal in" points, positions, or locations of the second and third vias 140, 142. The inputs or "signal in" points, positions, or locations may be where the differential traces 130a, 130b are connected to the second and third vias 140, 142. After propagating through the second and third vias 140, 142, the differential signal may exit the second and third vias 140, 142 at outputs or "signal out" points, positions, or locations of the second and third vias 140, 142. The outputs or "signal out" points, positions, or locations may be where the second and third vias 140, 142 are connected to the differential traces 132a, 132b. Alternatively, the inputs and outputs of the second and third vias 140, 142 may be reversed. For example, the differential signal may propagate along the differential traces 132a, 132b, enter the second and third vias 140, 142, propagate through the second and third vias 140, 142, exit the second and third vias 140, 142, and propagate along the differential traces 130a, 130b.

An alternative PCB stack-up may include a multi-drop configuration in which one or more signal vias have multiple outputs or "signal out" points, positions, or locations. For example, using the PCB stack-up 100 to illustrate, a third pair of differential traces may be disposed in or on a layer that is different in which the layers that the differential traces 130a, 130b and/or differential traces 132a, 132b are disposed, such as in or on the first layer 102a, the fourth layer 102d, the fifth layer 102e, and/or the sixth layer 102f. In addition, the third pair of differential traces may be connected to the second and third vias 140, 142. A differential signal may propagate along the differential traces 130a, 130b, enter and propagate through the second and third vias 140, 142, and exit the second and third vias 140, 142 at outputs of the second and third vias 140, 142 where the differential traces 132a, 132b are connected to the second and third vias 140, 142, and also where the third set of differential traces are connected to the second and third vias 140, 142. In alternative PCB stack-ups having a multi-drop configuration, there may be more than two outputs of the signal vias connected to more than two traces. For example, a fourth pair of differential traces may be disposed in or on a layer that is different than the layers that the differential traces 130a, 130b, differential traces 132a, 132b, and/or the third pair of traces are disposed.

In the second portion 136 of the PCB stack-up 100, a second signal conductor path may include the single ended trace 126 and the single ended trace 128. The sixth via 148 may be connected to the single ended trace 126 and the single ended trace 128 and may provide a transition from the single-ended trace 126 to the single-ended trace 128, or vice versa. For example, a signal may propagate along single ended trace 126 and enter into the sixth via 148 at an input or "signal in" point, position, or location of the sixth via 148. The input or "signal in" point, position, or location may be where the trace 126 is connected to the sixth via 148. After propagating through the sixth via 148, the signal may exit the sixth via 148 at an output or "signal out" point, position, or location of the sixth via 148. The output or "signal out" point, position, or location may be where the sixth via 148 is connected to the single ended trace 128. Alternatively, the input and output of the sixth via 148 may be reversed. For example, the signal may propagate along the single ended trace 128, enter the sixth via 148, propagate through the sixth via 148, exit the sixth via 148, and propagate along the single ended trace 126. An alternative PCB-stack up having a single-ended trace may comprise a multi-drop configuration, where the signal comprises multiple outputs or "signal out" points, positions, or locations, as previously described.

In other example PCB stack-ups, a signal conductor path may include more than two signal conductors and/or more than one signal via connecting the more than two signal conductors. For example, the first signal conductor path in the first portion 134 may further include one or more other differential traces disposed in the first layer 102a, the fourth layer 102d, the fifth layer 102e, the sixth layer 102f, on the first surface 104a of the first layer 102a and/or on the second surface 114b of the sixth layer 102f. One or more signal vias may connect the one or more other differential traces to the differential traces 130a, 130b and/or the differential traces 132a, 132b. A differential signal may propagate along the differential traces 130a, 130b, through the second and third vias 140, 142, propagate along the differential traces 132a, 132b, and then transition through a second pair of vias and transition to one of the other differential traces, or vice versa. Alternatively or in addition, the one or more other differential traces may include one or more signal conductors disposed in a layer that is the same as one of the layers that the differential traces 130a, 130b and/or 132a, 132b, but in a different part of the PCB stack-up 100. For example, a third pair of differential traces may be disposed in the second layer 102b. A differential signal may propagate along the differential traces 130a, 130b, may transition through the second and third vias 140, 142 and to the differential traces 132a, 132b, and may then transition through another pair of vias and to differential traces disposed in the second layer that are not connected to the differential traces 130a, 132b in the second layer. Similar configurations may be possible for the single-ended transmission lines in the second portion 136.

A transmission line may have an associated impedance. The associated impedance may be referred to as a characteristic impedance or impedance, and may be dependent upon various parameters, including a dielectric constant of the substrate material, a width or widths of one or more conductive traces of the transmission line, a thickness of the layer, and/or a spacing between the conductive traces if there is more than one conductive trace, such as a differential pair of traces. The parameters may be predetermined to configure the transmission line to have a desired characteristic impedance. The characteristic impedance may be any value or any range of values that is suitable for propagation of signals over the transmission line. In one example, a characteristic impedance of a single-ended transmission line may be approximately 50 ohms. In another example, a characteristic impedance of a differential transmission line may be approximately 100 ohms. Other characteristic impedances for single-ended and differential transmission lines may be determined.

One or more signal vias may also have an associated impedance. The associated impedance of a signal via may be dependent upon the dielectric constant of the substrate material surrounding the via, a size or sizes or one or more cutout portions of one or more ground references, a distance from the one or more signal vias to one or more reference structures, and/or a length of the signal via. The associated impedance of the signal via may be less than the associated impedances of the transmission lines that the signal via may be connected to. As an example, a single-ended transmission line may have an impedance of approximately 50 ohms. An impedance of a signal via in connection with the single ended conductor of the single-ended transmission line may be between approximately 35 ohms and approximately 45 ohms. As another example, a differential transmission line may have an impedance of approximately 100 ohms. An impedance of a pair of vias in connection with the differential signal conductors of the differential transmission line may be in a range of between approximately 75 ohms and approximately 90 ohms.

Two different transmission lines of a path may be configured to have the same or substantially the same characteristic impedances. In addition, the characteristic impedance of the signal via connecting the different transmission lines may be lower than the characteristic impedances of the transmission lines. For example, in the first portion 134, the transmission line having the differential traces 130a, 130b may have the same or substantially the same characteristic impedance of the differential traces 132a, 132b, such as approximately 100 ohms. The plated portions of the second and third vias 140, 142, in connection with the differential traces 130a, 130b, and 132a, 132b may have a characteristic impedance that is less than the characteristic impedance of the differential traces 130a, 130b, and 132a, 132b. As an example, where the characteristic impedance of the differential traces 130a, 130b and 132a, 132b is approximately 100 ohms, the characteristic impedance of the plated portions of the second and third vias 140, 142 may be in the range of between approximately 75 ohms and approximately 90 ohms. Other ranges or a range that is larger or smaller than between approximately 75 ohms and approximately 90 ohms are possible. Similarly, in the second portion 136, the transmission line having the single-ended trace 126 may have the same or substantially the same characteristic impedance as the single-ended trace 128, such as about 50 ohms. The plated portion of the sixth via 148 in connection with the single-ended traces 126 and 128 may have a characteristic impedance that is less than the characteristic impedance of the single-ended traces 126 and 128, such as in the range of between approximately 35 ohms and approximately 45 ohms.

Different or substantially different impedances in a signal path may be referred to as an impedance mismatch. Impedance mismatch may have an effect of signal reflection, in which at least some of the energy of a signal propagating from an input to an output may be reflected back toward the input. This may result in signal loss, in which less than all of the energy transmitted in a signal is not transmitted from the input to the output. Where the impedances of the signal path over the entire signal path, such as through one signal conductor, through a signal via, and to another signal conductor, is the same or substantially the same, the amount of energy reflection may be nothing or negligible, resulting in negligible or substantially negligible signal loss.

Figure 2:
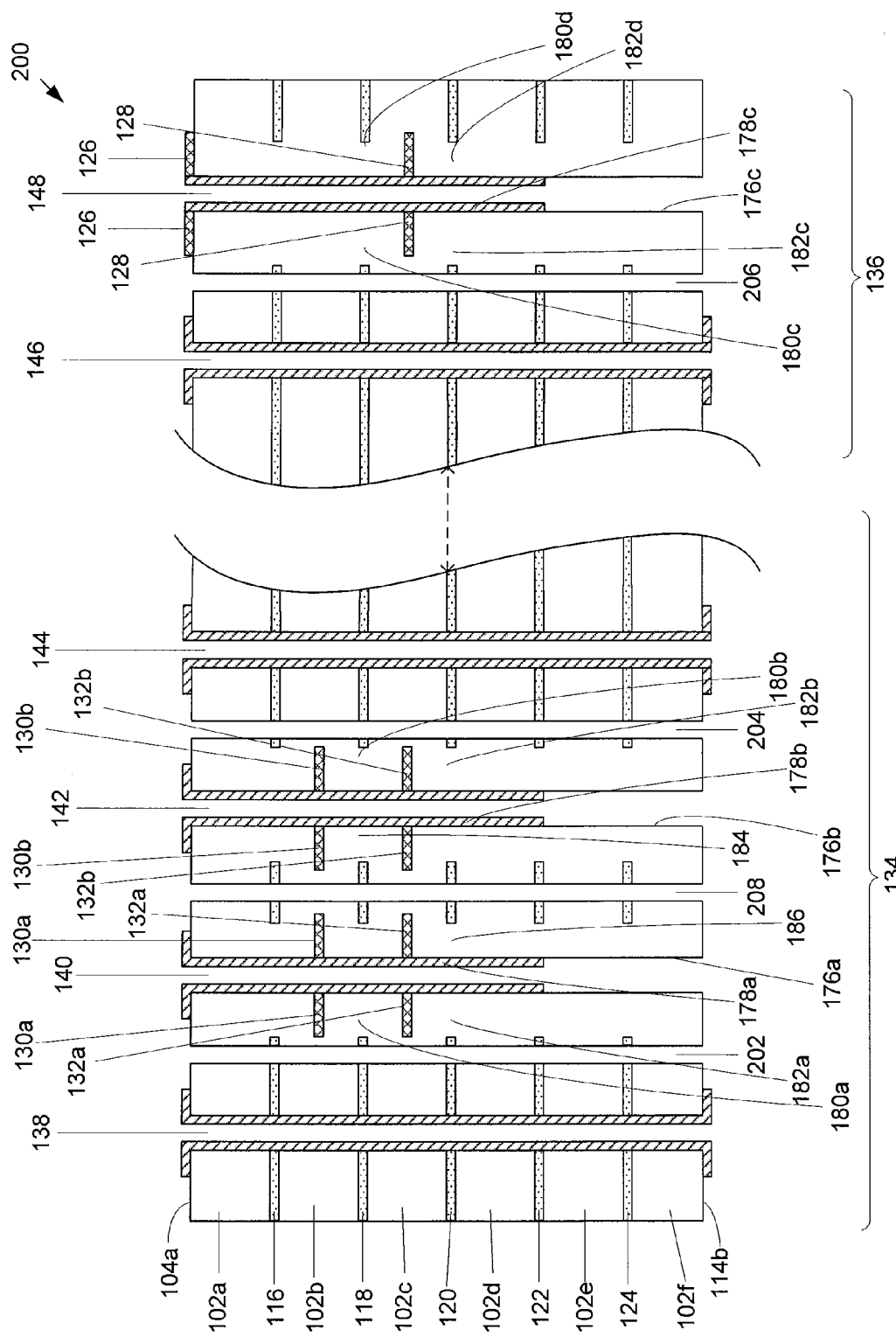
FIG. 2 illustrates a cross-sectional view of an alternative example embodiment of a stack of printed circuit board layers.

FIG. 2 shows an example PCB stack-up 200 that includes the PCB stack-up 100, and further includes at least one unplated via that is disposed a distance from a signal via that is less than or approximately equal to a distance from the signal via to a reference structure that is at least part of the return conductor path. The at least one unplated via may be disposed in between or substantially between the signal via and the reference structure. The distance from the signal via may be determined by center positions of the vias, by the inner walls of the vias, or a combination thereof. Also, the distance may be a distance that is perpendicular or substantially perpendicular to the reference structures, such as the first via 138, the second via 140, the third via 142, the fourth via 144, the fifth via 146, and/or the sixth via 148. In addition or alternatively, the distance may be a distance that is parallel or substantially parallel to the planar layers 102a, 102b, 102c, 102e, 102f and/or the ground references 116, 118, 120, 122, 124.

As an example, in the first portion 134 of the example PCB stack-up 200 in FIG. 2, the at least one unplated via may include two unplated vias, namely a first unplated via 202 and a second unplated via 204. The first unplated via 202 may be disposed at a distance from the signal via 140 that is less than or approximately equal to a distance from the signal via 140 to the ground via 138, which is at least a portion of the return conductor path for a differential signal propagating along differential conductive traces 130a, 130b and 132a, 132b, as previously described. In addition, as shown in FIG. 2, the first unplated via 202 may be disposed in between or substantially in between the signal via 140 and the ground via 138. Similarly, the second unplated via 204 may be a distance that is less than, equal to, or substantially equal to a distance from the signal via 142 to the ground via 144, which is at least a portion of the return conductor path for the differential signal propagating along differential conductive traces 130a, 130b and 132a, 132b, as previously described. In addition, as shown in FIG. 2, the second unplated via 204 may be disposed in between or substantially in between the signal via 142 and the ground via 144. In other example PCB stack-ups, only one of the unplated via 202 and the unplated 204 via may be included. In addition or alternatively, there may be other unplated vias that are disposed at a distance that is greater than the distance from the signal via 140 and the ground via 138 and/or from the signal via 142 to the ground via 144.

Similarly, in the second portion 136, a third unplated via 206 may be disposed at a distance from the signal via 148 that is less than, equal to, or substantially equal to a distance from the signal via 148 to the ground via 146, which is at least a portion of the return conductor path for a signal propagating along single ended traces 126, 128, as previously described. In addition, as shown in FIG. 2, the third unplated via 206 may be disposed in between or substantially in between the signal via 148 and the ground via 146. Alternatively or in addition, one or more unplated vias, other than the third unplated via 206, may be included. One or more of the other unplated vias may be disposed at a distance that is less than, equal to, or substantially equal to a distance from the signal via 148 to the ground via 146. For example, one or more of the other unplated vias may be disposed at a distance that is greater the distance from the signal via 146 to the ground via 148.

The PCB stack-up 200 may further include one or more unplated vias disposed in between or substantially in between one or more pairs of differential traces. For example, an unplated via 208 is disposed in between differential traces 130*a*, 130*b* and differential traces 132*a*, 132*b*.

One or more of the unplated vias, such as the unplated vias 202, 204, 206, 208, may extend at least partially through at least one layer of the PCB stack-up. In the PCB stack-up 200, each of the unplated vias 202, 204, 206, 208 extends an entire length of the PCB stack-up 200 that is perpendicular or substantially perpendicular to the opposing planar surfaces of the layers, from the first surface 104*a* of the first layer 102*a* to the second surface 114*b* of the sixth layer 102*f*. Other variations in the directions and/or lengths that the unplated vias 202, 204, 206, 208 may extend through the PCB stack-up 200 are possible. For example, an unplated via may extend in only one layer, from one opposing planar surface to the other opposing planar surface of the only one layer, or from one opposing planar surface to a position within the layer. Alternatively, the unplated via may extend more than one layer but less than the entire length of the PCB stack-up, from one exposed outer layer surface (e.g., the first surface 104*a* of the first layer 102*a*) to the other exposed outer layer surface (e.g., the second surface 114*b* of the sixth layer 102*f*).

Alternatively or in addition, the unplated via may extend in one or more of the layers in or on which there are conductive traces. As an example, for the PCB stack-up 200, in the first portion 134, the unplated via may extend in the second layer 102*b* and/or the third layer 102*c*. In the second portion 136, the unplated via may extend in the first layer 102*a* and/or the third layer 102*c*. Alternatively or in addition, the unplated via may extend in the layers for which the signal via has conductive plating. As an example, for the PCB stack-up 200, the unplated via may extend in the first, second, third, and/or fourth layers 102*a*-102*d*.

The unplated via may extend in a direction that is perpendicular or substantially perpendicular to one or more opposing planar surfaces of one or more layers. Alternatively, the unplated via may extend in a direction other than perpendicular or substantially perpendicular to the one or more opposing planar surfaces of the one or more layers. In some examples, the unplated via may extend in a direction that is in a range of approximately thirty degrees to approximately ninety degrees with reference to one or more of the opposing planar surfaces. Alternatively or in addition, the unplated via may include a plurality of unplated vias that are disposed in different layers and are in alignment or in substantial alignment with each other. The different layers may be sequential layers or non-sequential layers. For example, in the PCB stack-up 200, the unplated via may include a first unplated via extending in the first layer and a second unplated via extending in the third layer 102*c*, where the first unplated via and the second unplated via are in alignment or substantial alignment with each other.

The unplated via may be referred to as an air via to indicate the environment (e.g., air) that is occupying the unplated via hole. The air via may be configured in the PCB stack-up 200 to reduce an effective dielectric constant of an area surrounding at least a portion of one or more signal vias, such as an area surrounding a single signal via connected to a single-ended conductive trace, an area surrounding a signal via of a pair of signal vias connected to a differential pair of conductive traces, or an area surrounding the pair of vias. The area surrounding the one or more signal vias may be defined by one or more predetermined distances from one or the signal vias or a position between the pair of signal vias. An example predetermined distance may be a distance from a signal via to a reference structure that is at least a portion of the return conductor path for a signal propagating through the signal via. Another example predetermined distance may be a distance from one signal via to the other signal via of the pair of signal vias. Another example predetermined distance may be a distance from a middle point between the two signal vias to the reference structure. It should be appreciated that other predetermined distances are possible. The predetermined distances may be exact or precise distances. Alternatively, the predetermined distances may be approximate distances used to approximately or generally define an area surrounding one or more signal vias.

The area surrounding the one or more signal vias may be circular, elliptical, rectangular, or square, although the area may defined by shapes. Alternatively, the area surrounding the one or more signal vias may be substantially amorphous having one or more boundaries defined by one or more predetermined distances. The signal via or the middle point between the pair of signal vias may be a center position of the area. As an example, for a circular area, where the predetermined distance is a distance from the signal via to the reference structure, the predetermined distance may be a radius of the circular area. As an another example, for a rectangular area, where the predetermined distance is a distance from the signal via to the reference structure, the predetermined distance may be a distance from the center of the rectangular area to one or more borders of the rectangular area. As another example, for an elliptical area, where the predetermined distance is a distance from the middle point between the pair of signal vias to a reference structure, the distance may be a radius of a major or a minor axis of the elliptical area surrounding the pair of signal vias. The air via may be disposed in the area surrounding the one or more signal vias. The effective dielectric constant in the area surrounding the one or more signal vias may be a combination of the dielectric constant of the substrate material and the dielectric constant of the air in the air via. The dielectric constant of air may be less than the dielectric constant of the substrate material. The effective dielectric constant of the area surrounding the one or more signal vias that includes the combined dielectric constants of the air and the substrate may be less than the dielectric constant of the substrate alone. As an example, the dielectric constant of air may be about 1. The dielectric constant of the substrate may be in a range of between approximately 3.5 to approximately 5. The effective dielectric constant in the area may be less than the dielectric constant of the substrate material, such as approximately 3.0, for example. Without the air via, the effective dielectric constant of the area surrounding the one or more signal vias may be the dielectric constant of the substrate material in the area. The area where the air via is present has an effective dielectric constant that is lower than the dielectric constant of the area when the air via is not present.

The characteristic impedance of the signal via may be inversely proportional to the effective dielectric constant of the area surrounding the one or more signal vias. As the effective dielectric constant decreases, the characteristic impedance of the one or more signal vias increases. As previously described, the characteristic impedance of the one or more signal vias without the air via in the area surrounding the one or more signal vias may be less than the characteristic impedance of the transmission lines that the one or more signal vias are connected to. Where the air via is included in the area surrounding the one or more signal vias, the effective dielectric constant of the area may decrease, which may increase the characteristic impedance of the one or more signal vias to an impedance that is closer to the impedance of the transmission lines. An increased characteristic impedance may reduce the impedance mismatch in the signal conductor path, which may reduce the amount of energy that is reflected in the signal and overall signal loss.

The air via being disposed in the area surrounding the signal via, such as by being disposed in between the signal via and the reference structure, may extend through one or more cutout portions of one or more of the ground references 116-124. For example, in FIG. 2, the unplated via 202 may extend through the cutout portion 180a and/or the cutout portion 182a. Similarly, the unplated via 204 may extend through the cutout portion 180b and/or the cutout portion 182b. Also, the unplated via 206 may extend through the cutout portion 180c and/or the cutout portion 182c. Alternatively or in addition, the unplated via 208 may extend through cutout portion 184 and/or cutout portion 186. Alternatively or in addition, the unplated vias 202, 204, 206, 208 may extend through other cutout portions of the first, fourth, and/or fifth ground references 116, 122, 124. By extending through the cutout portions between the signal via and the references structure, the unplated vias may decrease the mutual coupling and/or crosstalk between the signal via and an adjacent signal via or an adjacent differential pair of signal vias (not shown).

Also, the unplated vias may extend through the PCB stack-up 200 in the area surrounding the signal via such that the unplated vias extend adjacent one or more via stubs. As examples, the unplated via 202 may be disposed adjacent the via stub 178a. The unplated via 208 may be disposed adjacent the via stubs 178a and 178b. The unplated via 204 may be disposed adjacent the via stub 178b. The unplated via 206 may be disposed adjacent the via stub 178c. The unplated vias adjacent the via stubs may reduce the capacitance generated by the via stub, which may reduce signal loss and/or impedance mismatch in the signal conductor path.

FIGS. 3-6 are top views of a layer of a PCB stack-up, such as PCB stack-up 200, showing various example configurations of one or more air vias. The one or more air vias may be disposed in the area surrounding one or more signal vias, as previously described.

The one or more air vias may have various cross sections, such as circular, elliptical, obround (e.g., "pill-shaped" or oval shaped), "C"-shaped, rectangular, triangular, pentagonal, hexagonal, heptagonal, octagonal, star-shaped, or any other geometrically-shaped cross sections. Also, one or more of the air vias may have a size (e.g., a diameter) that is smaller, the same, substantially the same, or larger than a size of the signal via and/or a size of the reference structure.

Figure 3:
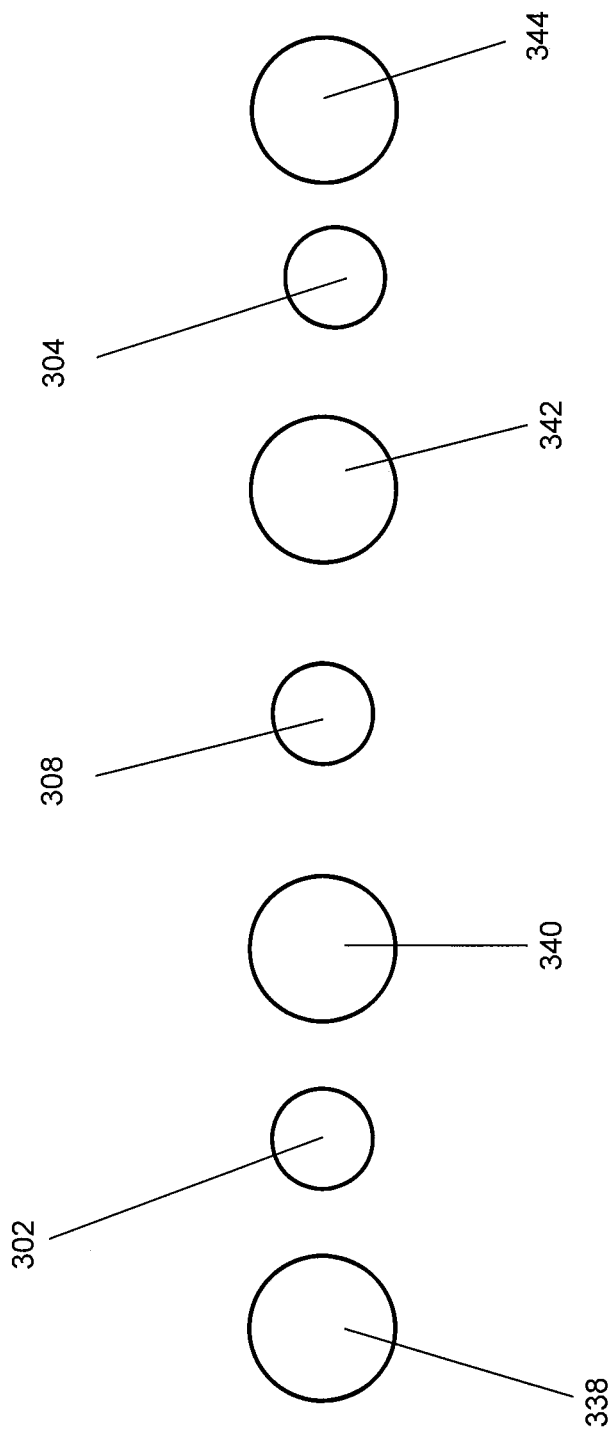
FIG. 3 illustrates a top view of a layer of a printed circuit board, showing an example configuration of one or more air vias.

In FIG. 3, an example configuration of one or more air vias may include an air via 302 disposed in an area surrounding a signal via 340 and/or an area surrounding a pair of signal vias that includes the signal via 340 and a signal via 342. In addition, the air via 302 may be disposed in between or substantially in between the signal via 340 and a reference structure 338. Alternatively or in addition, the configuration of one or more air vias may include an air via 304 disposed in an area surrounding the signal via 342 and/or the area surrounding the pair of signal vias 340 and 342. Also, the air via 304 may be disposed in between or substantially in between the signal via 342 and a reference structure 344. Alternatively or in addition, the configuration of one or more air vias may include an air via 308 disposed in the area surrounding the signal via 340, the area surrounding the signal via 342, and/or the area surrounding the pair of signal vias 340, 342. Also, the air via 308 may be disposed in between or substantially in between the pair of signal vias 340, 342.

Figure 4:
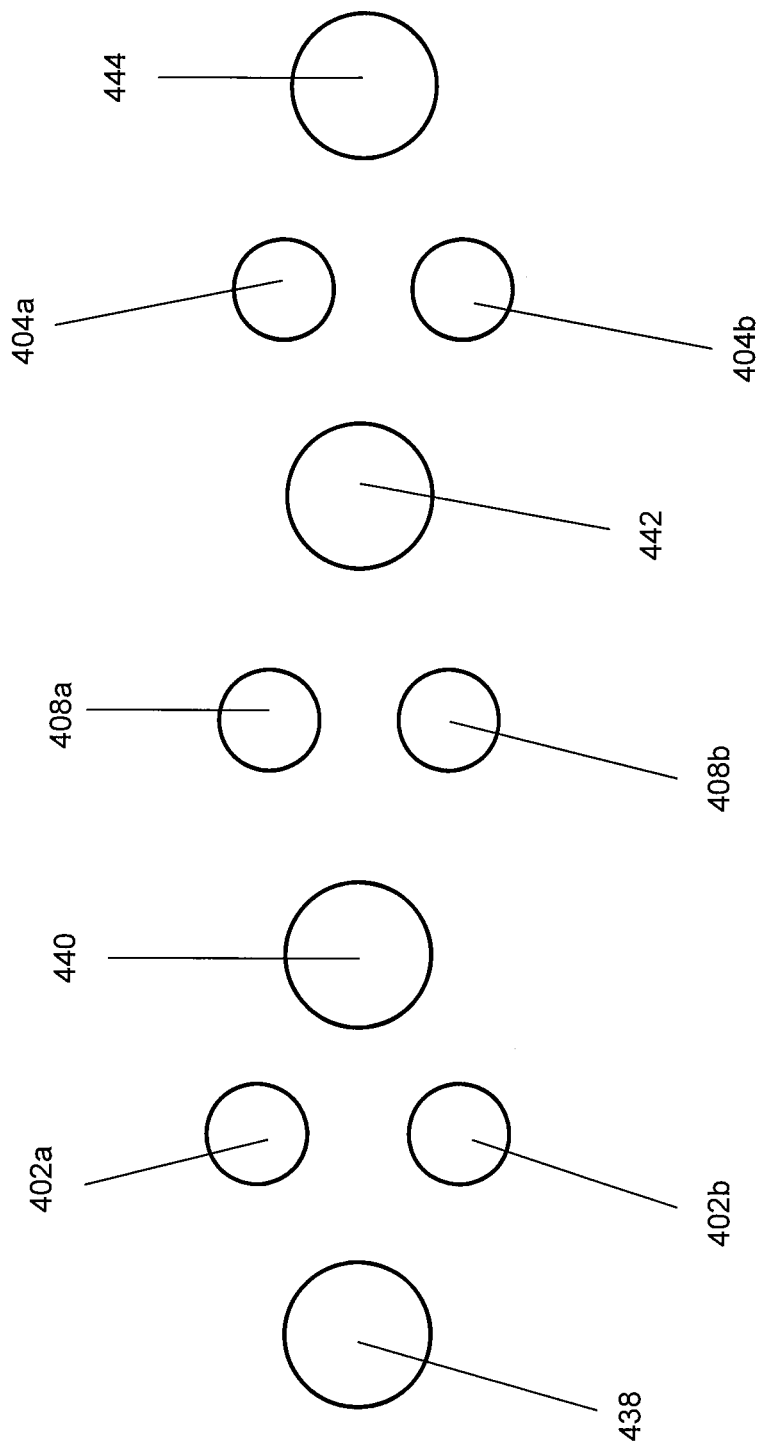
FIG. 4 illustrates a top view of a layer of a printed circuit board, showing an alternative example configuration of one or more air vias.

In FIG. 4, another example configuration of one or more air vias may include a plurality of air vias 402, including air vias 402a, 402b, disposed in an area surrounding a signal via 440 and/or an area surrounding a pair of signal vias that includes the signal via 440 and a signal via 442. In addition, the air vias 402a, 402b may be disposed in between or substantially in between the signal via 440 and a reference structure 438. Alternatively or in addition, the configuration of one or more air vias may include a plurality of air vias 404, including air vias 404a, 404b, disposed in an area surrounding the signal via 442 and/or the area surrounding the pair of signal vias 440 and 442. Also, the air vias 404a, 404b may be disposed in between or substantially in between the signal via 442 and a reference structure 444. Alternatively or in addition, the configuration of one or more air vias may include a plurality of air via 408a, 408b disposed in the area surrounding the signal via 440, the area surrounding the signal via 442, and/or the area surrounding the pair of signal vias 440, 442. Also, the air vias 408a, 408b may be disposed in between or substantially in between the pair of signal vias 440, 442.

Figure 5:
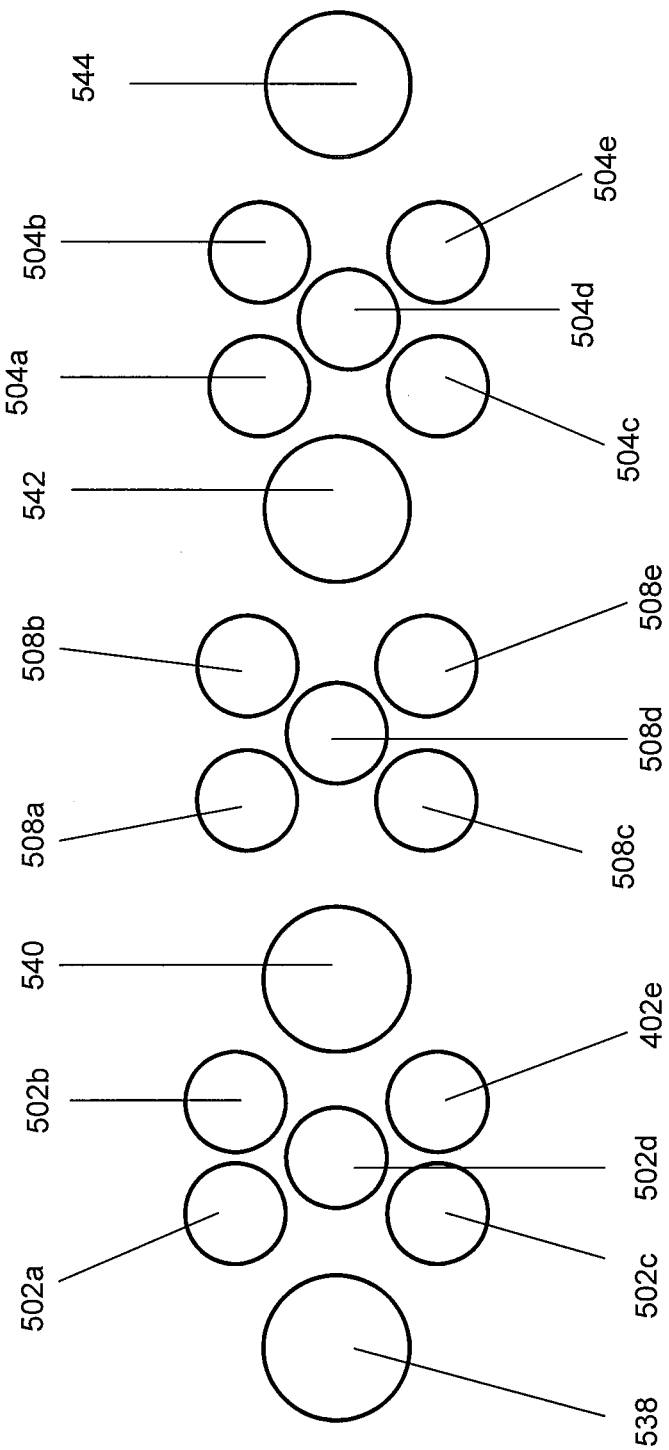
FIG. 5 illustrates a top view of a layer of a printed circuit board, showing a second alternative example configuration of one or more air vias.

In FIG. 5, another example configuration of one or more air vias may include a plurality of air vias 502, including air vias 502a, 502b, 502c, 502d, 502e disposed in an area surrounding a signal via 540 and/or an area surrounding a pair of signal vias that includes the signal via 540 and a signal via 542. In addition, the air vias 502a, 502b, 502c, 502d, 502e may be disposed in between or substantially in between the signal via 540 and a reference structure 538. Alternatively or in addition, the configuration of one or more air vias may include a plurality of air vias 504, including air vias 504a, 504b, 504c, 504d, 504e disposed in an area surrounding the signal via 542 and/or the area surrounding the pair of signal vias 540 and 542. Also, the air vias 504a, 504b, 504c, 504d, 504e may be disposed in between or substantially in between the signal via 542 and a reference structure 544. Alternatively or in addition, the configuration of one or more air vias may include a plurality of air via 508a, 508b, 508c, 508d, 508e disposed in the area surrounding the signal via 540, the area surrounding the signal via 542, and/or the area surrounding the pair of signal vias 540, 542. Also, the air vias 508a, 508b may be disposed in between or substantially in between the pair of signal vias 540, 542.

Figure 6:
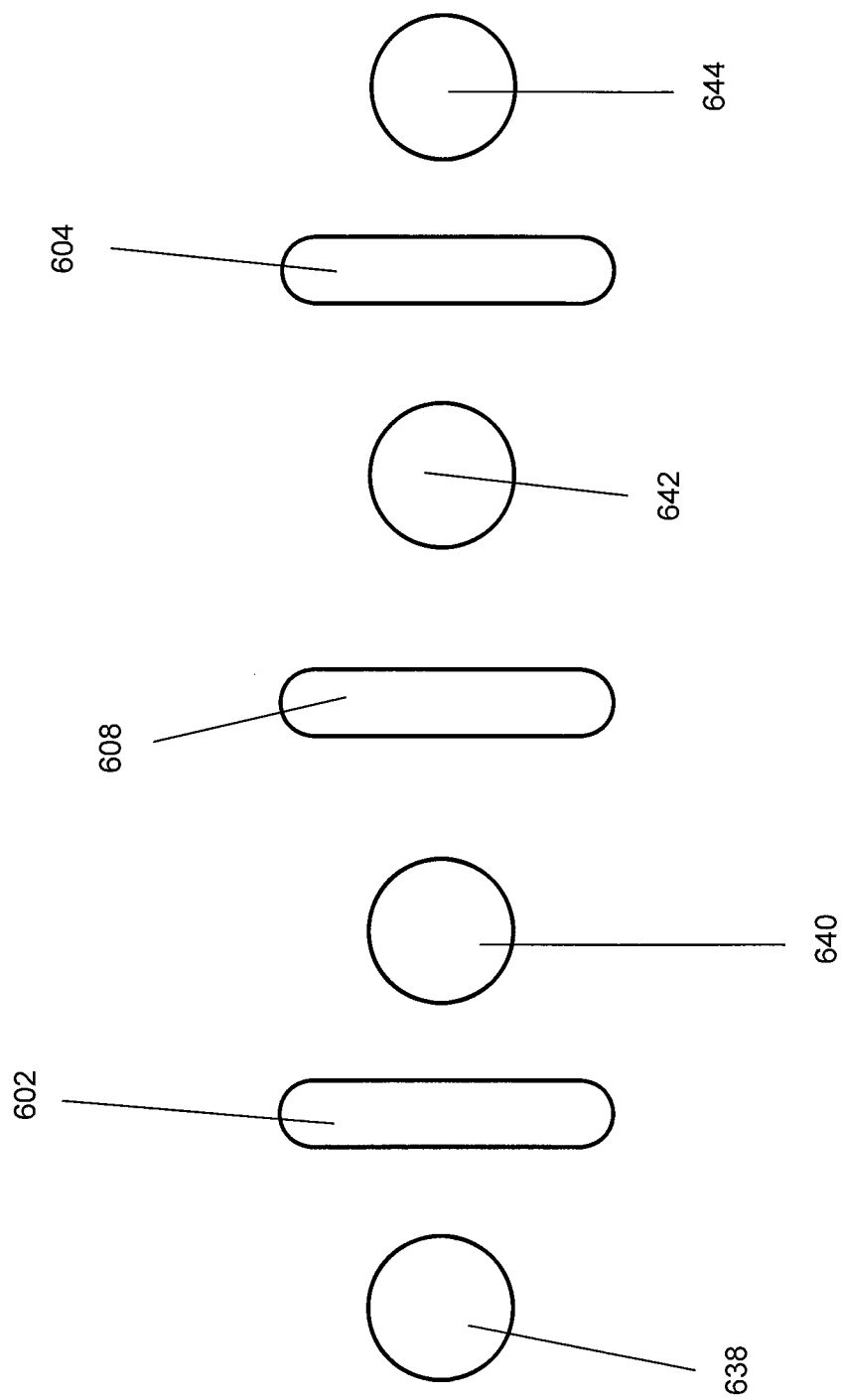
FIG. 6 illustrates a top view of a layer of a printed circuit board, showing a third alternative example configuration of one or more air vias.

In FIG. 6, another example configuration of one or more air vias may include an air via 602 disposed in an area surrounding a signal via 640 and/or an area surrounding a pair of signal vias that includes the signal via 640 and a signal via 642. In addition, the air via 602 may be disposed in between or substantially in between the signal via 640 and a reference structure 638. Alternatively or in addition, the configuration of one or more air vias may include an air via 604 disposed in an area surrounding the signal via 642 and/or the area surrounding the pair of signal vias 640 and 642. Also, the air via 604 may be disposed in between or substantially in between the signal via 642 and a reference structure 644. Alternatively or in addition, the configuration of one or more air vias may include an air via 608 disposed in the area surrounding the signal via 640, the area surrounding the signal via 642, and/or the area surrounding the pair of signal vias 640, 642. Also, the air via 608 may be disposed in between or substantially in between the pair of signal vias 640, 642. Additionally, as shown in FIG. 6, the air vias 602, 604, and 608 comprise an obround shape.

The example configurations shown in FIGS. 3-6 are non-limiting and are merely illustrative. Other configurations or one or more combinations of the configurations shown in FIGS. 3-6 may be used. For example, the numbers of air vias disposed in between a signal via and a reference structure and between the pair of signal vias may not be equal, may have different cross-sectional shapes, and/or may have different sizes. In addition, air vias may not be present between a signal via and an adjacent reference structure (e.g., between signal via 340 and reference structure 338 or signal via 342 and reference structure 344) or between a pair of signal vias (e.g., signal via 340 and signal via 342). For example, one or more of air vias 302, 402, 502, 602, one or more air vias 304, 404, 504, 604, and/or one or more air vias 308, 408, 508, 608 may not be present. In addition, similar or other configurations of air vias may be used for a single-ended transmission line. In the single-ended transmission line, one or more air vias may be disposed in an area surrounding a signal via connected to a single-ended trace. Additionally, the one or more areas may or may not be disposed in between and/or substantially in between the signal via and a reference structure. Other via configurations are possible.

The air vias may be formed at any suitable time, such as before, after, or during the formation of the other vias, such as the ground vias, power supply vias, and/or the signal vias. For example, the air vias may be formed when one or more of the other vias are formed. During an imaging process, the air vias may be selected and/or separated from the other vias so that the air vias are not plated during the plating process. Alternatively, the air vias may be formed after the other vias are drilled and/or plated, and/or the PCB stack-up is manufactured, such as by laminating the layers together.

Figure 7:
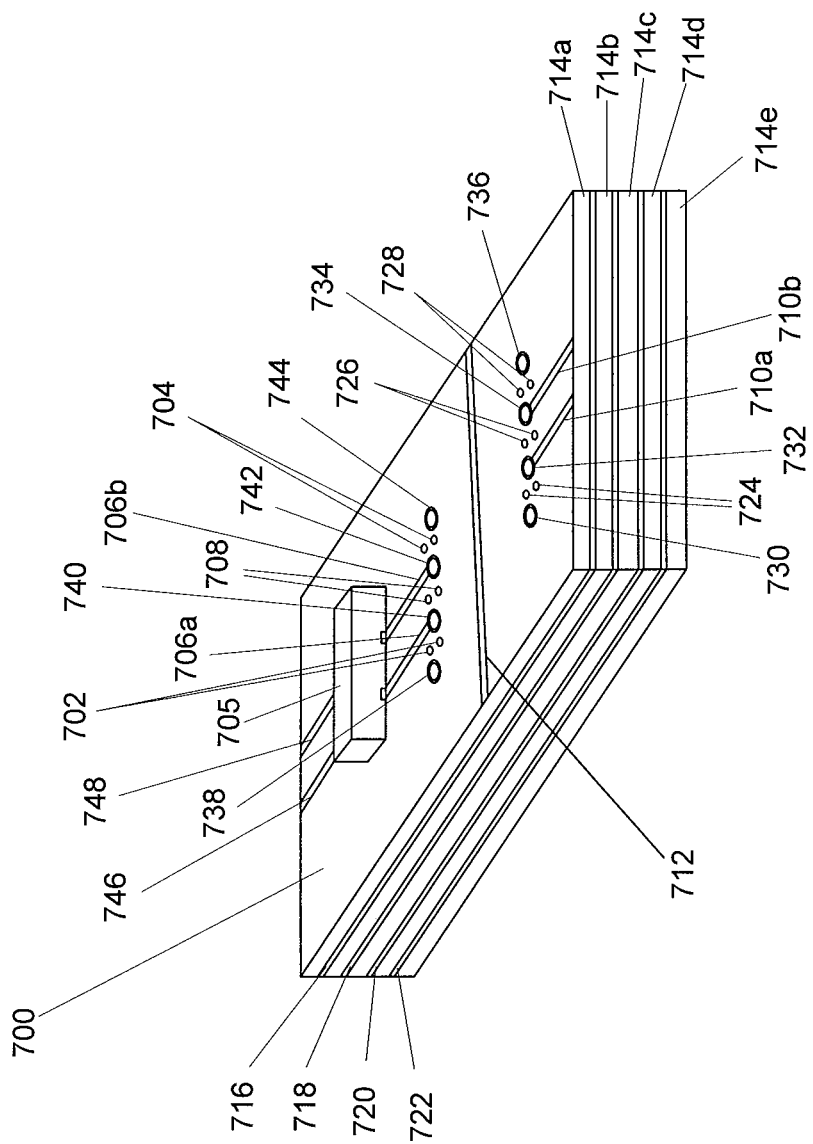
FIG. 7 illustrates a perspective view of an example printed circuit board stack-up connected to an active device.

FIG. 7. illustrates a perspective view of an example PCB stack-up 700 (or a portion of a PCB stack-up) connected to an active device 705. The example PCB stack-up 700 includes five layers 714a, 714b, 714c, 714c, 714d, 714e separated by four ground reference planes 716, 718, 720, 722. The PCB stack-up 700 includes a differential signal path comprising differential signal traces 710a, 710b disposed on an outer (or top) planar surface of a first layer 714a, and differential traces 706a, 706b disposed on the outer surface of the first layer 714a. The differential signal path further includes signal vias 732, 734 connected to the differential signal traces 710a, 710 and signal vias 740, 742 connected to the differential vias 706a, 706b. The differential signal path may further include one or more additional differential signal traces disposed in or on one or more layers of the PCB stack-up 700 other than the first layer 714a, such as layers 714b, 714c, 714d, and/or 714e (not shown). The signal vias 734, 734 and 740, 742 may be connected to the one or more additional differential signal traces. In addition, the differential signal traces 710a, 710b and the differential signal traces 706a, 706b may be interconnected through the signal vias 732, 734, 740, 742 and the one or more additional differential signal traces.

The differential signal traces 706a, 706b may be connected to the active device 705. In addition, FIG. 7 shows two other traces 746, 748 connected to the active device 705. In one example, the differential signal traces 706a, 706b may provide a differential input signal to the active device 705 and the two other traces 746, 748 may provide an output path for an output signal of the active device 705. Alternatively, the two other traces may provide the differential input signal to the active device 705 and the differential signal traces 706a, 706b provide an output path for the output signal of the active device 705. In other examples, more or fewer traces connected to the active device 705 may be connected to the active device 705, as will be appreciated by one of ordinary skill in the art.

The signal vias 732, 734, 740, 742 may transition a portion of the signal path to a layer other than the first layer 714a to divert the signal path from an obstructing object, such as signal trace 712, which may prevent the signal traces 710a, 710b from being directly connected to signal traces 706a, 706b on the outer surface of the first layer 714a. In other example PCB stack-ups, one or more obstructing objects other than or in combination with the trace 712 may prevent a direct connection of signal paths in or on a single layer, such as an electronic component and/or an active device.

In one example, the differential traces 710a, 710b may be input signal traces and a differential signal may propagate along the differential traces 710a, 710b and enter "signal in" points of the signal vias 732, 734 as previously described. The differential signal may propagate through the signal vias 732, 734, exit the signal vias 732, 734, and propagate along the one or more additional differential signal traces disposed in or on one or more layers other than the first layer 714a (now shown). The differential signal may enter a "signal in" point of the signal vias 740, 742 in one of the other layers, propagate through the signal vias 740, 742, and exit the signal vias 740, 742. The differential signal may propagate along the differential signal traces 706a, 706b, which may be input traces of the active device 705, and the differential signal may be input to the active device 705. Alternatively, the differential traces 706a, 706b may be output traces of the active device 705. In the alternative example, the differential signal is output from the active device 705, propagates along the differential signal traces 706a, 706b, transitions through the signal vias 740, 742, propagates along the one or more additional differential signal traces (not shown) and signal vias 732, 734, exits the signal vias 732, 734, and propagates along the differential traces 710a, 710b.

Reference structures, such as ground vias 730, 736, 738, and 744, may be located near the signal vias 732, 734, 740, 742 to function as return paths for a differential signal propagating along the differential signal path. In addition, unplated vias (e.g., air vias) 702, 704, 708, 724, 726, and/or 728 may be disposed in between or substantially in between the signal vias and the reference structures. For example, unplated vias 702 may be disposed in between or substantially in between the signal via 740 and the reference structure 738; unplated vias 704 may be disposed in between or substantially in between the signal via 742 and the reference structure 744; unplated vias 724 may be disposed in between or substantially in between the signal via 732 and the reference structure 730; and/or unplated vias 728 may be disposed in between or substantially in between the signal via 734 and the reference structure 736. In addition or alternatively, unplated vias 708 may be disposed in between or substantially in between the signal via 740 and the signal via 742; and/or unplated vias 726 may be disposed in between or substantially in between the signal via 732 and the signal via 734. As previously described, the unplated vias 702, 704, 708, 724, 726, 728 configured and/or positioned near the signal vias 732, 734, 740, 742 and the reference structures 730, 736, 738, 744, may decrease an effective dielectric constant of an area surrounding the signal vias 732, 734, 740, 742, which may yield a characteristic impedance of the signal vias 732, 734, 740, 742 that is closer to a characteristic impedance of the differential signal traces 706a, 706b, 710a, 710b than if the 702, 704, 708, 724, 726, and/or 728 were not part of the PCB stack-up 700.

Various embodiments described herein can be used alone or in combination with one another. The foregoing detailed description has described only a few of the many possible implementations of the present invention. For this reason, this detailed description is intended by way of illustration, and not by way of limitation.

What is claimed is:

1. A printed circuit board (PCB) stack-up comprising:
   a plurality of layers comprising a first layer and a second layer;
   a signal path configured to communicate a signal, the signal path comprising:
       a first trace associated with the first layer;
       a second trace associated with the second layer;
       a signal via electrically connected to the first trace and the second trace, wherein the signal via comprises a connection portion that is part of the signal path and a conductive via stub portion that is not part of the signal path;
   a reference structure that is at least a portion of a return path for the signal; and
   an unplated via disposed adjacent the conductive via stub portion.

2. The apparatus PCB stack-up of claim 1, wherein the unplated via is disposed in between the signal via and the reference structure.

3. The PCB stack-up of claim 1, wherein the signal via comprises a first signal via, wherein the signal comprises a differential signal, and wherein the PCB stack-up further comprises:
   a second signal via, the first signal via and the second signal via being configured to transmit the differential signal through the first layer and the second layer.

4. The PCB stack-up of claim 3, wherein the unplated via comprises a first unplated via, and wherein the PCB stack-up further comprises:
   a second unplated via disposed in between the first signal via and the second signal via.

5. The PCB stack-up of claim 3, wherein the reference structure comprises a first reference structure, wherein the unplated via comprises a first unplated via, and wherein the PCB stack-up further comprises:
   a second reference structure that is at least a portion of the return path for the differential signal; and
   a second unplated via disposed in an area surrounding the second signal via.

6. The PCB stack-up of claim 1, wherein the unplated via comprises a first unplated via, and wherein the PCB stack-up further comprises:
   a second unplated via in the area surrounding the signal via, wherein the first unplated via and the second unplated via are substantially disposed in between the signal via and the reference structure.

7. The PCB stack-up of claim 1, wherein the reference structure comprises a ground via and is connected to one or more ground references of the PCB stack-up.

8. An apparatus comprising a printed circuit board (PCB) stack-up, the PCB stack-up comprising:
   a first PCB layer;
   a second PCB layer adjacent the first PCB layer and being separated from the first PCB layer by a ground reference;
   a signal via that is configured to transmit a signal from a first transmission line disposed in the first PCB layer to a second transmission line disposed in the second PCB layer;
   a reference structure that is at least a portion of a return path for the signal; and
   an unplated via disposed in an area surrounding at least a portion of the signal via,
   wherein the unplated via is disposed in the area to match a characteristic impedance of the signal via with at least one of a characteristic impedance of the first transmission line or a characteristic impedance of the second transmission line.

9. The apparatus of claim 8, wherein the unplated via extends completely through both the first PCB layer and the second PCB layer.

10. The apparatus of claim 8, wherein the unplated via extends at least partially through at least one of the first PCB layer and the second PCB layer.

11. The apparatus of claim 8, wherein the unplated via comprises a first unplated via, and wherein the PCB stack-up further comprises:
    a second unplated via disposed in the area surrounding the at least a portion of the signal via,
    wherein the first unplated via extends at least partially through the first PCB layer, and
    wherein the second unplated via extends at least partially through the second PCB layer.

12. The apparatus of claim 8, wherein the signal via extends from the first PCB layer to the second PCB layer,
    wherein the ground reference comprises a cutout portion surrounding the signal via, and wherein the unplated via extends through the cutout portion.

13. The apparatus of claim 8, wherein the signal via comprises a via stub, and
    wherein the unplated via is disposed adjacent the via stub.

14. The apparatus of claim 8, wherein the first transmission line comprises a stripline configuration, and wherein the second transmission line comprises a stripline configuration.

15. The apparatus of claim 8, wherein the first transmission line comprises a microstrip configuration, and wherein the second transmission line comprises a stripline configuration.

16. A stack of printed circuit board (PCB) layers, the stack of PCB layers comprising:
    a signal conductor path configured to transmit a radio frequency RF signal, the signal conductor path comprising:
        a first signal conductor in a first PCB layer of the stack;
        a second signal conductor in a second PCB layer of the stack; and
        a signal via in connection with the first signal conductor and the second signal conductor, wherein the signal via comprises a connection portion that is part of the signal path and a conductive via stub portion that is not part of the signal path;
    a reference structure extending in the first and second PCB layers; and
    an unplated via disposed substantially in between the signal via and the reference structure, wherein a portion of the unplated via is proximate the conductive via stub portion,
    wherein the unplated via is disposed substantially in between the signal via and the reference structure to match a characteristic impedance of the signal via having the conductive via stub portion to at least one of a characteristic impedance of the first signal conductor or a character impedance of the second signal conductor.

17. The stack of PCB layers of claim 16, wherein the first signal conductor comprises a first differential pair of conductive traces,
wherein the second signal conductor comprises a second differential pair of conductive traces,
wherein the unplated via comprises a first unplated via, and
wherein the stack of PCB layers further comprises:
a second unplated via disposed in between the first and second pairs of differential conductive traces.

18. The stack of PCB layers of claim 16, wherein the unplated via comprises a first unplated via, and
wherein the stack of PCB layers further comprises a second unplated via disposed substantially in between the signal via and the reference structure.

19. The stack of PCB layers of claim 16, wherein the reference structure comprises a plated via that is configured to provide a power supply signal.

20. The stack of PCB layers of claim 16, wherein the unplated via comprises an obround cross-section.

21. The PCB stack-up of claim 1, wherein the unplated via is disposed adjacent the via conductive stub portion in order to match a characteristic impedance of the signal via with the conductive via stub portion to at least one of a characteristic impedance of the first trace or a characteristic impedance of the second trace.

* * * * *